(12) United States Patent
Chen (10) Patent No.: US 8,371,715 B2
(45) Date of Patent: Feb. 12, 2013

(54) LED ILLUMINATOR MODULE WITH HIGH HEAT-DISSIPATING EFFICIENCY AND MANUFACTURING METHOD THEREFOR

(75) Inventor: Yan-Hua Chen, Tainan (TW)

(73) Assignee: Catcher Technology Co., Ltd., Tainan (TW)

( * ) Notice: Subject to any disclaimer, the term of this patent is extended or adjusted under 35 U.S.C. 154(b) by 323 days.

(21) Appl. No.: 12/886,970

(22) Filed: Sep. 21, 2010

(65) Prior Publication Data

US 2012/0069543 A1 Mar. 22, 2012

(51) Int. Cl.
*F21V 33/00* (2006.01)
(52) U.S. Cl. ............... 362/249.02; 362/84; 362/294
(58) Field of Classification Search ........... 362/84, 362/249.02, 294, 218
See application file for complete search history.

(56) References Cited

U.S. PATENT DOCUMENTS

| | | | | |
|---|---|---|---|---|
| 2007/0023769 | A1* | 2/2007 | Nishimoto et al. | 257/88 |
| 2007/0187708 | A1* | 8/2007 | Setomoto et al. | 257/99 |
| 2007/0247855 | A1* | 10/2007 | Yano | 362/294 |
| 2010/0220473 | A1* | 9/2010 | Park | 362/231 |

* cited by examiner

*Primary Examiner* — Laura Tso
(74) *Attorney, Agent, or Firm* — Houtteman Law LLC (57) ABSTRACT

An LED illuminator module with high heat-dissipating efficiency and manufacturing method therefore is provided. The LED illuminator module includes a flat heat pipe (FHP) formed with a flat surface, an insulated layer formed on the plane of the flat heat pipe, a conducting layer having a pair of conducting electrode portions, a plurality of LEDs, and an encapsulation covers the LEDs. The insulation layer has a pair of insulated electrode portions and a plurality of LED-setting portions. The conducting electrode portions partially covered on the insulated electrode portions. The LEDs are disposed on the LED-setting portions and electrically connect to the pair of conducting electrode portions respectively. The encapsulation contains phosphor powder therein. The present invention solves the heat-dissipating problem of high-efficiency light module with the LEDs, and shorten heat-conductive path to enhance heat-dissipating efficiency.

18 Claims, 7 Drawing Sheets

LED ILLUMINATOR MODULE WITH HIGH HEAT-DISSIPATING EFFICIENCY AND MANUFACTURING METHOD THEREFOR

BACKGROUND OF THE INVENTION

1. Field of the Invention

The present disclosure is related to an LED illuminator module with high heat-dissipating efficiency and manufacturing method therefore, more specifically to an illuminator module having multiple LED chips is directly combined with a flat heat pipe and a manufacturing method thereof is also provided.

2. Description of Related Art

Light Emitting Diode (LED) has advantages of small size, long lifespan, low power consumption, luminescence and mercury free so that has become the main research project in illuminating field. The power development of LED is gradually advanced from low-power to high-power and has various application of early indicator light to current LED illuminating products.

Since the high power LED has wide range of applications, the demand of heat dissipation gradually increases. Thus, if heat could not go out properly, many problems will occur such as lowlight efficiency, short lifespan, unstable light color. Therefore, in heat conduction design, an efficient heat-dissipating structure is necessary for radiating the heat out of the illuminating module to avoid the aforementioned problems.

Heat sinks are the current heat-dissipating way of LED illuminators by increasing the heat-conductive area. However, heat sinks have disadvantages of lower heat-dissipating efficiency and bigger size. Some prior arts use a heat pipe coordinated with the heat sink to increase the heat-dissipating efficiency but the LED illuminator module manufacture cost would increase as well.

Moreover, all of the aforementioned heat-dissipation ways have the same disadvantage, in which the heat of LED elements has to radiate through a Printed Circuit Board (PCB). The PCB is a low heat conductive material, so that the heat generated by LED elements can not efficiently and quickly radiate out of the LED illuminator module. Metal core PCB (MCPCB) of prior art is developed to improve the high heat resistance of the PCB. However, the heat generated by the LED elements still need to go through the multi-layers of the MCPCB, thermal grease (or thermal paste) and then arrive the heat pipe.

Furthermore, a retention kit with complex structure usually uses to fix the LED elements on heat pipe and heat sink. The retention kit not only increases cost but also has big size. Besides, assembling the retention kit considerably consumes manpower.

SUMMARY OF THE INVENTION

The present disclosure provides an LED illuminator module with high heat-dissipating efficiency and manufacturing method, more specifically to solve the heat dissipating problem of a high-power illuminator equipped with a plurality of LED and shorten the heat-conducting path for improving the heat-dissipating efficiency by combining with the flat heat pipe.

In order to achieve the above objective, the present disclosure provides an LED illuminator module with high heat-dissipating efficiency, which includes a flat heat pipe having a flat surface, an insulated layer on the flat surface of the flat heat pipe, a conducting layer having a pair of conducting electrode portions, a plurality of LED respectively fixed on the LED-setting portions, and an encapsulation covered on the LED. The insulated layer includes a pair of insulated electrode portions and a plurality of LED-setting portions disposed between the pair of insulated electrode portions. The pair of conducting electrode portions is partially covered on the pair of the insulated electrode portions. The LED are fixed on the LED-setting portions respectively and electrically connected to the pair of conducting electrode portions by wires. The encapsulation contains phosphor powder.

In order to achieve the above objective, the present disclosure provides a manufacturing method for an LED illuminator module with high heat-dissipating efficiency, comprising the following steps.

A flat heat pipe is provided, and a flat surface is formed on the flat heat pipe. An insulated layer is formed on the flat surface of the flat heat pipe, wherein the insulated layer is divided as a pair of insulated electrode portions and a plurality of LED-setting portions between the pair of insulated electrode portions.

A conducting layer is formed on the insulated layer, wherein the conducting layer is divided as a pair of conducting electrode portions partially covered on the pair of insulated electrode portions respectively.

A plurality of LED are fixed on the LED-setting portions, and electrically connect the LED to the pair of conducting electrode portions with wires. Encapsulation covers on the LED, wherein the encapsulation includes phosphor powder.

According to one embodiment of the present disclosure, further comprising a partition ring which is formed on a periphery of the LED.

According to another embodiment of the present disclosure, wherein the flat heat pipe is formed with a concave portion and a plurality of blocking walls surrounding around the concave portion. The concave portion is formed with a flat bottom surface. The LED-setting portions and the LED are disposed on the flat bottom surface.

The present disclosure has following advantages.

First, the present disclosure did not need circuit board or metallic substrate. Therefore, the heat-conducting path between the LED and the flat heat pipe is shortened to increase heat-dissipating efficiency.

Next, the present disclosure can optionally provide the partition ring optionally on a periphery of the LED. When the partition ring uses a thermosetting plastic frame, its shape can be easily adjusted with high flexibility.

Further, the present disclosure can directly use the flat heat pipe to form the concave portion, and the partition ring is not necessary. Then, the LED illuminator module would be thinner. Moreover, the oblique blocking walls could be used for reflecting the light from the LED.

For further understanding of the present disclosure, reference is made to the following detailed description illustrating the embodiments and examples of the present disclosure. The description is for illustrative purpose only and is not intended to limit the scope of the claim.

DETAILED DESCRIPTION OF THE PREFERRED EMBODIMENTS

In order to have better understanding of the objective, structure, characteristics, and effects of the present disclosure, a description will be made with reference to preferred embodiments thereof and the accompanying drawings.

Figure 1A:
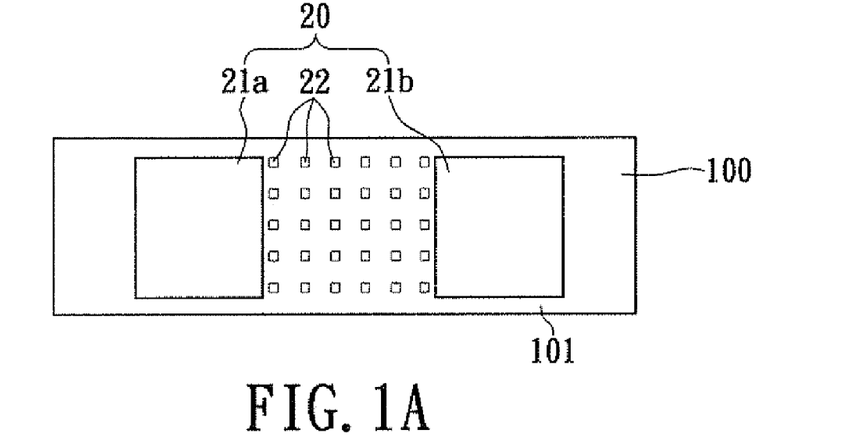
FIG. 1A to 1E are schematic views illustrating manufacturing processes of an LED illuminator module with high heat-dissipating efficiency of the first embodiment according to the present disclosure.

FIG. 1A to 1E illustrate schematic views of manufacturing processes of an LED illuminator module with high heat-dissipating efficiency of first embodiment according to the present disclosure. In FIG. 1A of the present disclosure, a flat heat pipe (Flat heat pipe, FHP) 100 is provided, and a flat surface 101 is formed on the flat heat pipe 100. The flat heat pipe 100 could be a rectangular board and better with multiple flowing channels, which can increase the volume of working fluid capacity, capillary force, and separate the flows of liquid phase and vapor phase for reducing the friction force between liquid phase and vapor phase.

Moreover, an insulation layer 20 is formed on the flat surface 101 of the flat heat pipe 100. The insulation layer 20 is divided as a pair of insulated electrode portions 21a, 21b, and a plurality of LED-setting portions 22 between the pair of insulated electrode portions 21a, 21b. The function of the insulation layer 20 is used to form a base layer for isolating the flat heat pipe 100. The LED-setting portions 22 are provided for LED (as the element 40 shown in FIG. 1C), so that the LED can have good insulation and well heat-conducted on the flat heat pipe 100.

The material of the insulation layer 20 could be high polymer material, especially for the insulation electrode portions 21a, 21b or an insulating material of lower thermal resistance and thermal conductive such as UV-curable resin, epoxy resin with high thermal conduction, epoxy resin plus glass fabric, or adhesive epoxy glass fiber cloth with well thermal conduction. An embodiment of the LED-setting portions 22 could be high conduction silver pastes which are formed on the flat heat pipe 100 by screen printing process and are baked about 30 minutes with temperature 90 to 100 Celsius.

Figure 1B:
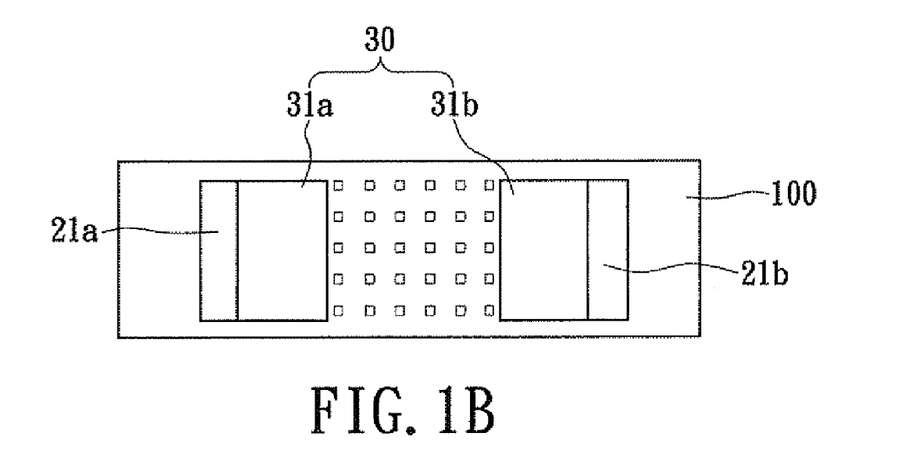

Please refer to FIG. 1B, a conducting layer 30 is formed on the insulation layer 20. In detail, the conducting layer 30 includes a pair of conducting electrode portions 31a, 31b which partially covers on the pair of insulated electrode portions 21a, 21b. The pair of conducting electrode portions 31a, 31b is recognized as electrodes to connect the power source. The conducting layer 30 with advantage of screen printing could be a conductive paste, such as copper paste, silver paste, silver-aluminum paste, aluminum paste, or precious metal paste. Alternatively, the conducting electrode portions 31a, 31b could be copper tinsel which could become a printed circuit via etching process for bearing a higher current.

The present disclosure can further partially apply on a solder-resistant layer according to the requirement. For example, the solder-resistant layer is formed by applying solder mask. The solder-resistant layer could partially cover the conducting layer 30, which can protect parts of the circuits and electrodes. The solder-resistant layer also could be applied on the flat heat pipe directly, to isolate the flat heat pipe from reacting oxidation with moisture in air. After the solder mask is applied, it could be further applied with an anti-oxidant surface to enhance anti-oxidant ability according to the requirements. According to the aforementioned way, the solder-resistant layer could be formed by screen printing.

Figure 1C:
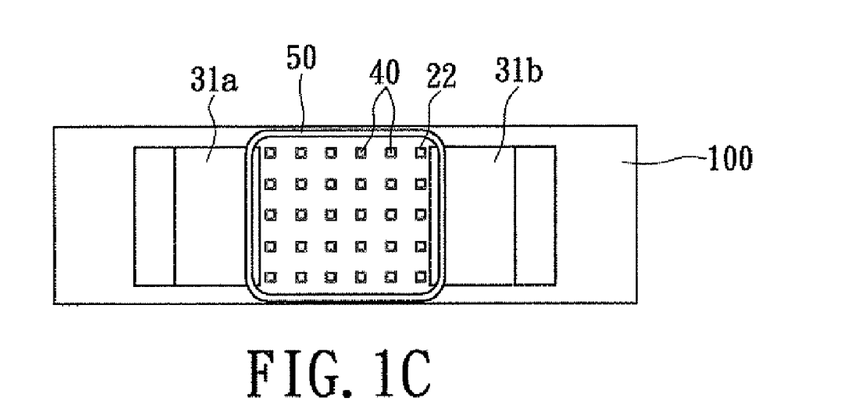

Please refer to FIG. 1C, which shows a diagram of chip layout of the present disclosure. In FIG. 1C, a plurality of LED chips 40 are fixed on the LED-setting portions 22. Besides, a partition ring 50 is provided on a periphery of the LED chips 40, to restrict and fix an encapsulation (as shown in FIG. 1E, element 60) which covers on the LED 40. A preferable way for reducing manufacturing steps of the present disclosure is starting a baking process around one to two hours at temperature degree of 150 Celsius after forming the copper tinsel (or printing copper paste), disposing the LED, forming the partition ring, and disposing an electrical connector at the conducting electrode portions.

The partition ring 50 could be selectively formed on the flat heat pipe 100, which can be replaced by the structure of the flat heat pipe 100. A detail will be described as the followings.

Figure 1D:
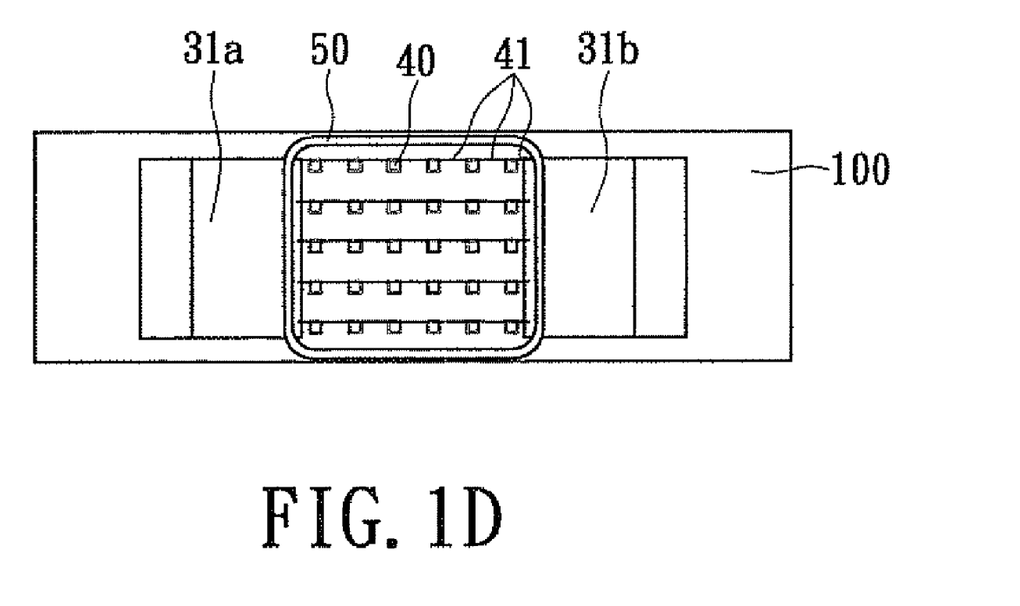
Figure 1E:
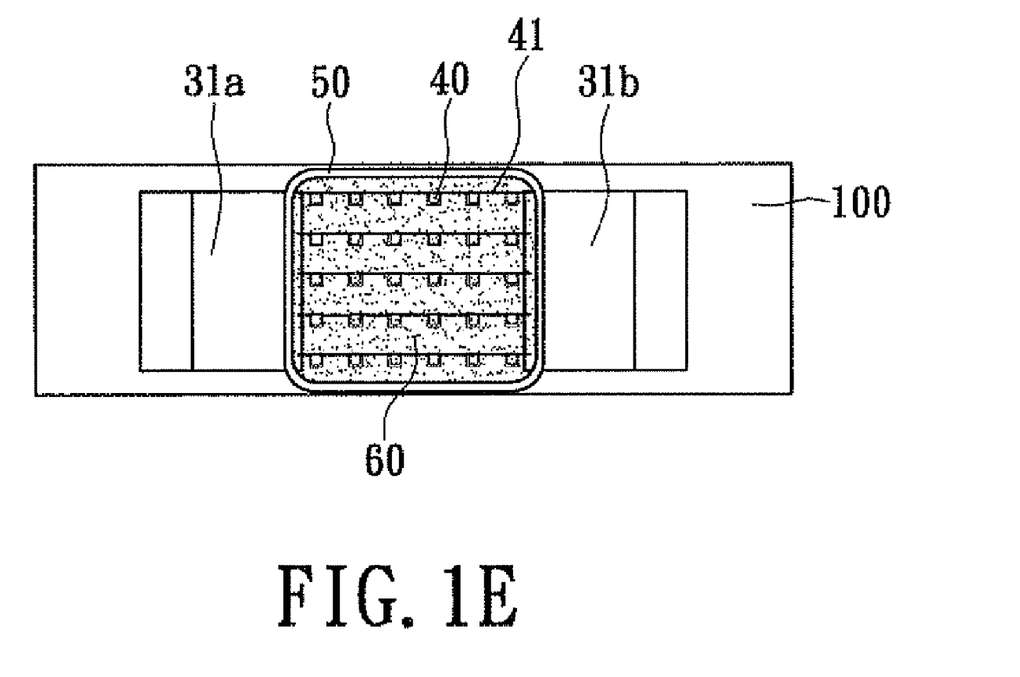

Please refer to FIG. 1D, which shows a diagram of wiring process of the present disclosure. After fixing the LED 40, the following step is to make electrical connections between the LEDs 40 and the pair of conducting electrode portions 31a, 31b with wires. In this embodiment, a wire bonding is shown for illustration. Each LED 40 has a pair of wires 41. The contiguous LEDs 40 interconnect with the wires 41 each other. The outmost LEDs are electrically connected to the pair of conducting electrode portions 31a, 31b with the wire 41. The aforementioned step of the partition ring 50 could start after the wire bonding process of the present disclosure. The wires 41 could be gold wire, copper wire, or aluminum wire.

Please refer to FIG. 1E, which is a top view of LED illuminator module with high heat-dissipating efficiency according to the present disclosure. Finally, an encapsulation 60 covers the LED 40, wherein the encapsulation 60 includes phosphor powder for mixing colors of light. Thus, the LED illuminator module with high heat-dissipating efficiency according to the present disclosure is finished. The phosphor powder mixed in the encapsulation 60 could be adjusted according to the requirement of the illuminator. After the encapsulation 60 is applied on the LED, the encapsulation 60 would be baked about one hour at temperature degree of 170 Celsius. The encapsulation 60 mixed with phosphor powder could be slightly protruded for a light-condensing function, or be a flat surface.

Figure 2A:
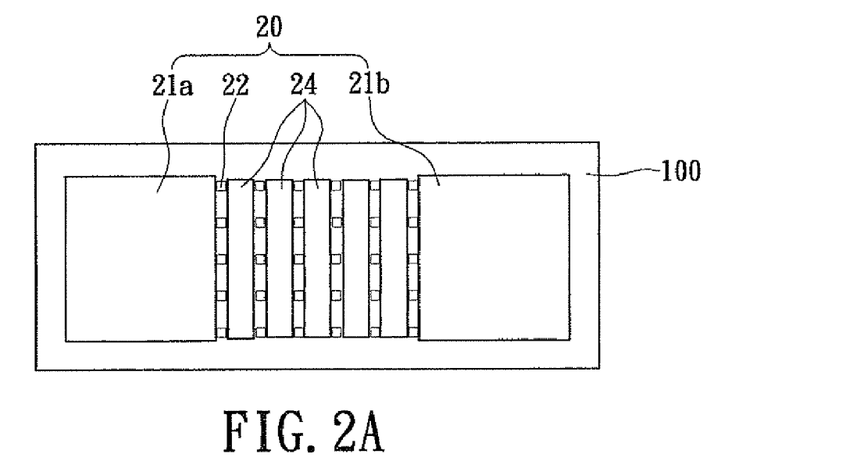
FIG. 2A to 2E are schematic views illustrating manufacturing processes for an LED illuminator module with high heat-dissipating efficiency of second embodiment according to the present disclosure.
Figure 2B:
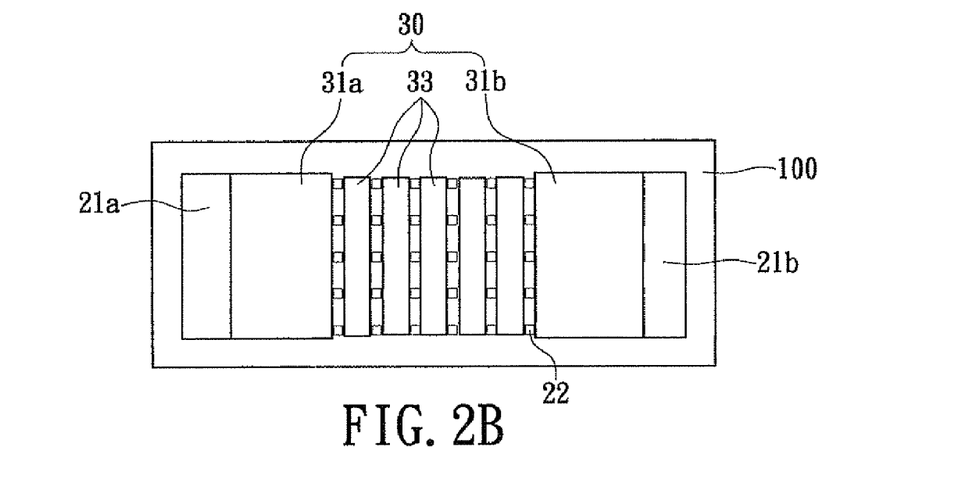

Please refer to FIGS. 2A to 2E, which are schematic views for illustrating manufacturing processes for an LED illuminator module with high heat-dissipating efficiency of the second embodiment according to the present disclosure. The difference between FIG. 2A and FIG. 1A is a plurality of insulation strip portions 24 are further provided, which are formed in the step of forming the insulation layer 20. The insulation strip portions 24 are parallel arranged on the flat heat pipe 100 and located between the LED-setting portions 22.

The difference between FIG. 2A and FIG. 1A is a plurality of conducting strip portions 33 will cover the insulation strip portions 24 in the step of forming the conducting layer 30.

Figure 2C:
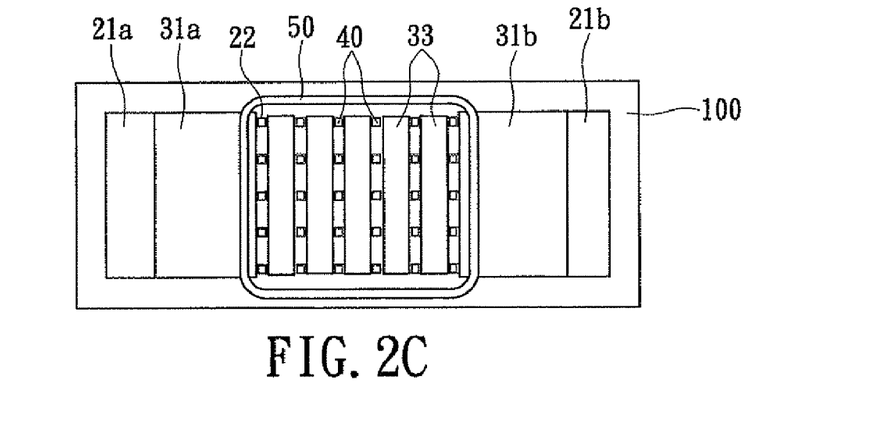

FIG. 2C is similar with FIG. 1C, in which the LEDs 40 are fixed on the LED-setting portions 22. Besides, the partition ring 50 covers a periphery of the LED 40, to restrict and fix the transparent LED 40 (as shown in FIG. 1, element 60).

Figure 2D:
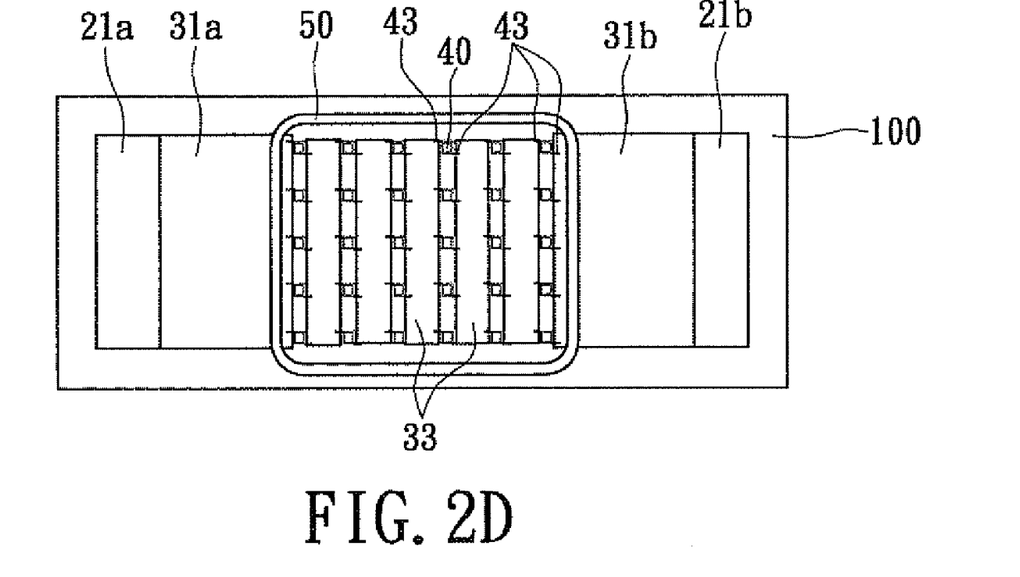

Please refer to FIG. 2D, in which wires 43 are different from the wires 41 in FIG. 1D. Each of the LED 40 has one wire 43 which is connected to the conducting strip portions 33, not to the contiguous LED. The outmost LEDs 40 use another wire 43 to electrically connect the pair of conducting electrode portions 31a, 31b. This embodiment has advantage of using the shorter wires 43. Since the bonding wires are made of precious metal, the shorter wires 43 can reduce cost and less resource of precious metal.

Figure 2E:
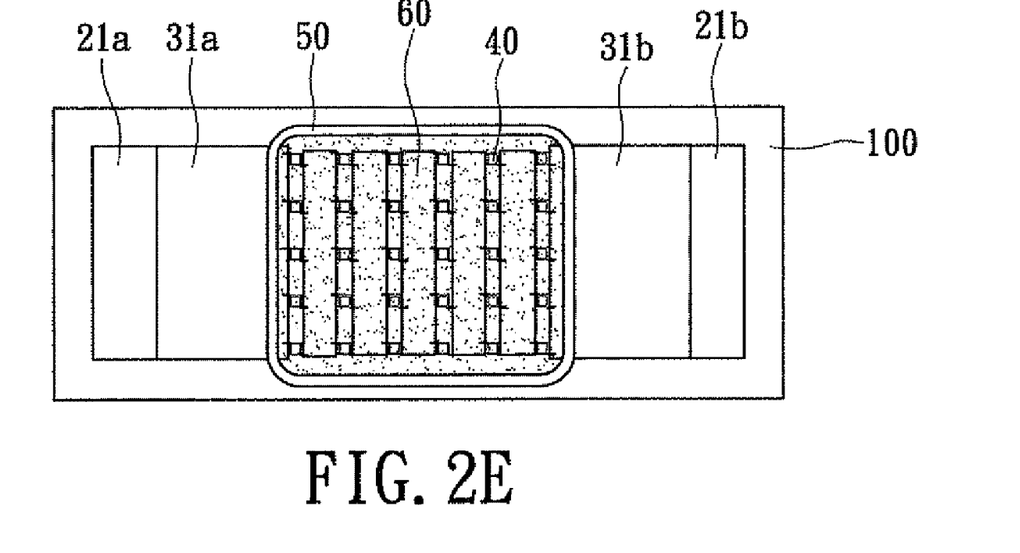

FIG. 2E is similar with FIG. 1E. The encapsulation 60 covers on the LED 40.

Figure 3:
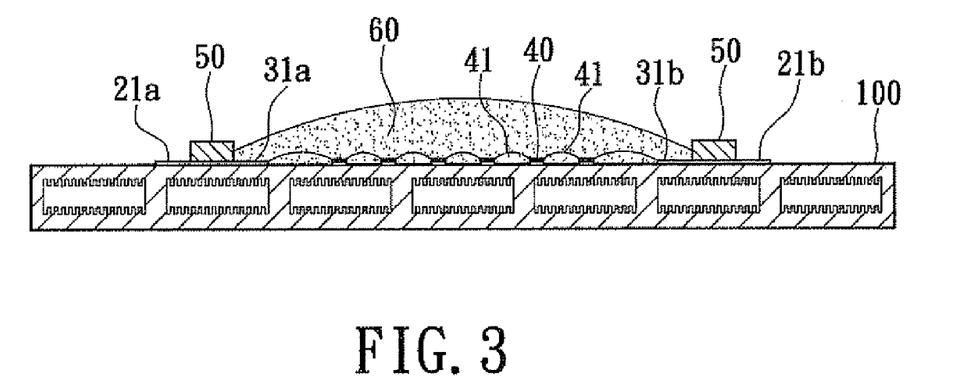
FIG. 3 is a cross-sectional view of FIG. 1E of the present disclosure.

Please refer to FIG. 3, which shows a cross-sectional view of FIG. 1E according to the present disclosure. In this embodiment, the partition ring 50 is made of metal material, which has advantage of well light-reflection. The metallic partition ring 50 in this Fig. is rectangular-shaped, but it is not limited by this shape. For example, the inner surface of the partition ring 50 can be concaved for enhancing light-condensing function.

Figure 4:
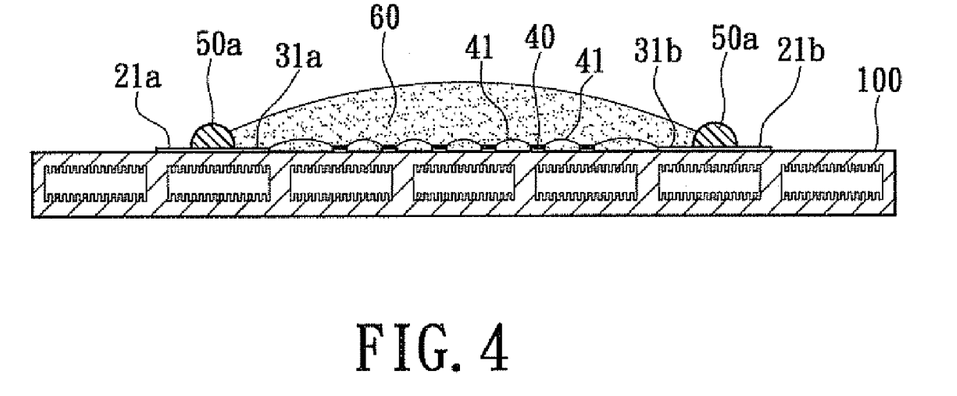
FIG. 4 is a cross-sectional view of FIG. 1E of another embodiment of the present disclosure.

Please refer to FIG. 4, which is a cross-sectional view of FIG. 1E of another embodiment of the present disclosure. In this embodiment, the partition ring 50a is a plastic frame made of opaque thermosetting plastic, which has advantage of easy adjustment for making different shapes, such as circle, square, or polygon. The plastic frame of light color also can enhance light-reflection function, such as silver dyestuff could be mixed therein. Furthermore, a reflective layer can be formed on the partition ring 50a of plastic material.

Figure 5:
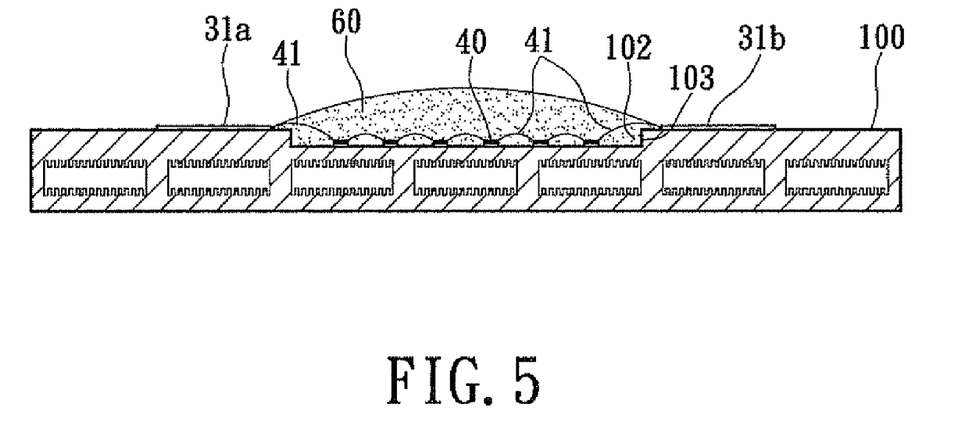
FIG. 5 is a cross-sectional view of the first embodiment of the present disclosure without a partition ring.

Please refer to FIG. 5, which shows a cross-sectional view of the first embodiment of the present disclosure without a partition ring. This embodiment according to the present disclosure can explain the partition ring being selectively omitted. In this method, a concave portion 102 is formed on the flat heat pipe 100, and the concave portion 102 has a flat bottom surface. The concave portion 102 is surrounded by a plurality of blocking walls 103. The LED-setting portions (not labeled), and the LEDs 40 are disposed on the flat bottom surface of the concave portion 102. The encapsulation 60 is restricted and fixed in the concave portion 102, which does not need the partition ring. The pair of insulated electrode portions (not labeled), and the pair of conducting electrode portions 31a, 31b are formed outside the concave portion 102 and are adjacent to the concave portion 102. The concave portion 102 can be formed by drilling, or grinding, or removing by cutting tools. This embodiment has advantage of well heat-conductive results, because the LEDs 40 are closer the working-fluid channels of the flat heat pipe 100. Besides, the total height of the LED illuminator module is lower than the previous embodiments, and has thinner size.

Figure 6:
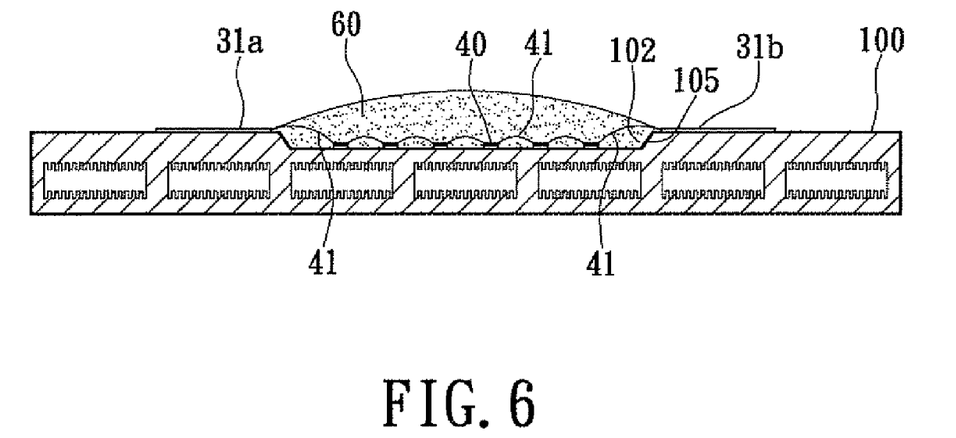
FIG. 6 is a cross-sectional view of the second embodiment of the present disclosure without a partition ring.

Please refer to FIG. 6, which illustrates a cross-sectional view of the second embodiment of the present disclosure without a partition ring. The difference between this embodiment and FIG. 5 is the blocking walls 105 formed with oblique surface. The concave portion 102 is surrounded by oblique-shaped blocking walls 105. The oblique blocking walls 105 preferably are formed with a reflecting surface for reflecting the light of the LED 40.

Figure 7:
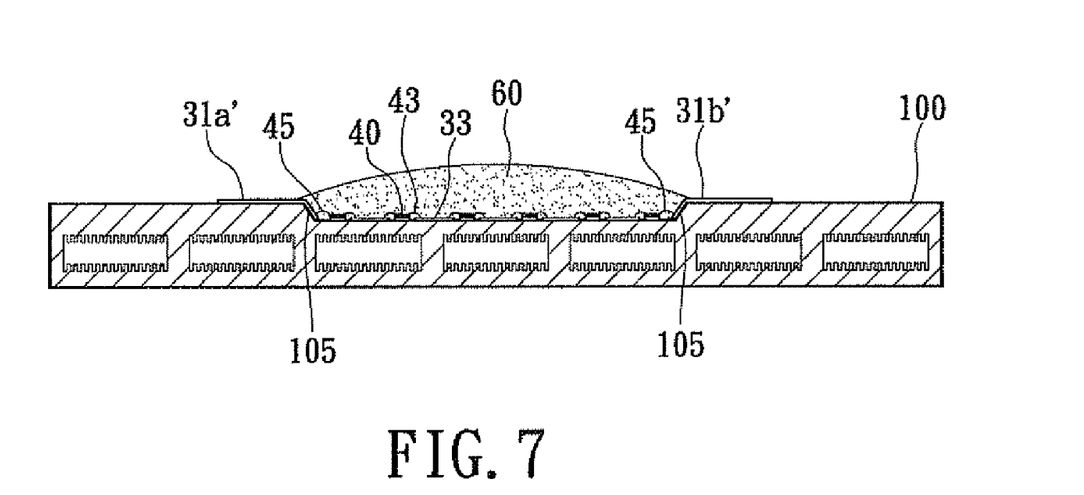
FIG. 7 is a cross-sectional view of the third embodiment of the present disclosure without a partition ring.

Please refer to FIG. 7, which is a cross-sectional view of third embodiment of the present disclosure without a partition ring. The difference between this embodiment and FIG. 6 is including the practicing ways of FIGS. 2A to 2E, which includes the conducting strip portions 33 and the insulated strip portions (not shown, be hidden) under the conducting strip portions 33. Further, this embodiment extends the pair of conducting electrode portions 31a', 31b' to the oblique blocking walls 105. This embodiment therefore has advantage of omitting the partition ring, using the shorter wires 43, 45 to electrically connect the LED 40 to the conducting strip portions 33 and the pair of conducting electrode portions 31a', 31b'.

Figure 8:
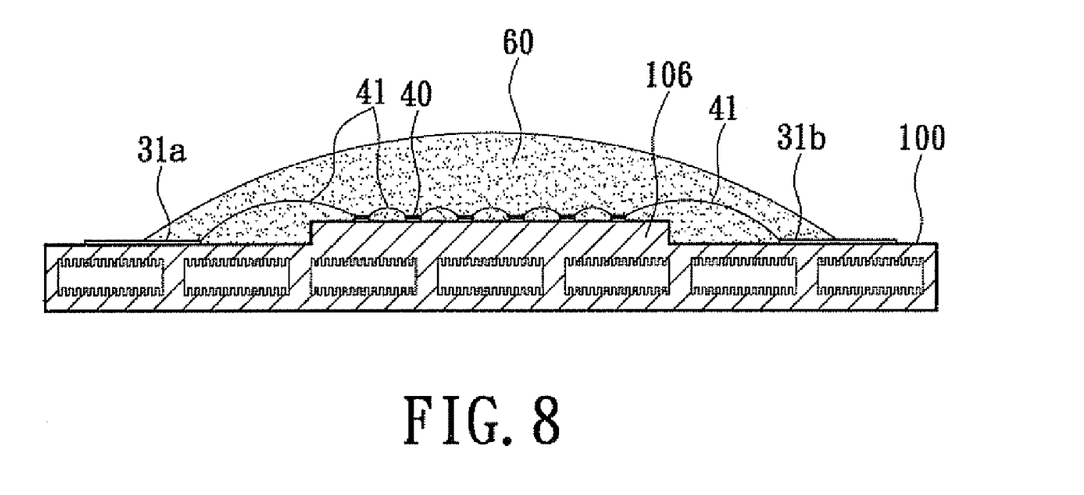
FIG. 8 is a cross-sectional view of the fourth embodiment of the present disclosure without a partition ring.

Please refer to FIG. 8, which is a cross-sectional view of the fourth embodiment of the present disclosure without the partition ring. The difference between this embodiment and FIG. 6 is a rising platform 106 replaced the concave portion. The LEDs 40 are disposed on the rising platform 106. The conducting electrode portions 31a, 31b are formed outside the rising platform 106. The encapsulation 60 covers the rising platform 106 and partially covers the pair of conducting electrode portions 31a, 31b.

Therefore, the present disclosure provides the LED illuminator module with high heat-dissipating efficiency and manufacturing method thereof, which has advantages and functions as followed:

1. The present disclosure directly disposes the LEDs 40 on the flat heat pipe 100 with well heat-dissipating characteristic, which does not require circuit board or metal substrate, so that the heat-conducting path between the LEDs 40 and the flat heat pipe 100 is shortened and the heat-dissipating efficiency is enhanced.

2. The present disclosure can be selectively equipped with the partition ring 50 outside the LEDs 40. When the partition ring 50a is made of plastic frame, it has easier adjustable characteristic and is more convenient to provide the partition ring of different shapes.

3. The present disclosure can directly form the concave portion 102 on the flat heat pipe 100, and the partition ring is not required. The total size of the LED illuminator module is thinner. Besides, the oblique blocking walls 105 is good to reflect the light of the LED chips 40.

The description above only illustrates specific embodiments and examples of the present disclosure. The present disclosure should therefore cover various modifications and variations made to the herein-described structure and operations of the present disclosure, provided they fall within the scope of the present invention as defined in the following appended claims.

What is claimed is:

1. An LED illuminator module with high heat-dissipating efficiency, comprising:
   a flat heat pipe, formed with a flat surface;
   an insulation layer formed on the flat surface of the flat heat pipe, the insulation layer including a pair of insulated electrode portions and a plurality of LED-setting portions disposed between the pair of insulated electrode portions;
   a conducting layer having a pair of conducting electrode portions partially covered on the pair of the insulated electrode portions;
   a plurality of LED fixed on the LED-setting portions respectively and electrically connected to the pair of conducting electrode portions with wires; and
   an encapsulation covers the LEDs, the encapsulation mixed with phosphor powder.

2. The LED illuminator module with high heat-dissipating efficiency of claim 1, wherein each of the LED is connected with a pair of wires, contiguous two of the LEDs are connected with the wires, the outmost LEDs are connected with the conducting electrode portions with one of the wires.

3. The LED illuminator module with high heat-dissipating efficiency of claim 1, wherein the insulation layer further comprises a plurality of insulated strip portions formed on the flat heat pipe in a parallel way and located between the LED-setting portions, the conducting layer further comprises a plurality of conducting strip portions covered on the insulation strip portions.

4. The LED illuminator module with high heat-dissipating efficiency of claim 3, wherein each of the LED is connected a pair of wires, one of the wires is connected to the conducting strip portions, and the outmost LEDs are connected to the conducting electrode portions by one of the wires.

5. The LED illuminator module with high heat-dissipating efficiency of claim 1, further comprising a partition ring formed at a periphery of the LEDs.

6. The LED illuminator module with high heat-dissipating efficiency of claim 5, wherein the partition ring is a colloid bar.

7. The LED illuminator module with high heat-dissipating efficiency of claim 1, wherein the flat heat pipe has a concave portion and a plurality of blocking walls surrounding the concave portion, the concave portion has a flat bottom surface, wherein the LED-setting portions and the illuminating LEDs are disposed on the flat bottom surface of the concave portion, wherein the encapsulation is fixed in the concave portion.

8. The LED illuminator module with high heat-dissipating efficiency of claim 7, wherein the pair of insulated electrode portions and the pair of conducting electrode portions are formed outside the concave portion.

9. The LED illuminator module with high heat-dissipating efficiency of claim 7, wherein the blocking walls are oblique and are formed with a reflecting surface to reflect the light from the LEDs.

10. The LED illuminator module with high heat-dissipating efficiency of claim 1, wherein the encapsulation has a top surface or being a flat surface.

11. A manufacturing method for an LED illuminator module with high heat-dissipating efficiency, comprising steps as followed:
provewing a flat heat pipe, and forming a flat surface on the flat heat pipe;
forming an insulation layer on the flat surface of the flat heat pipe, wherein the insulation layer is divided as a pair of insulated electrode portions, and a plurality of LED-setting portions between the pair of insulated electrode portions;
forming a conducting layer on the insulation layer, wherein the conducting layer is divided as a pair of conducting electrode portions partially covered on the pair of insulated electrode portions respectively;
fixing a plurality of LEDs on the LED-setting portions, and electrically connecting the LEDs to the pair of conducting electrode portions with wires; and
covering an encapsulation on the LED chips, wherein the encapsulation including phosphor powder.

12. The manufacturing method for LED illuminator module with high heat-dissipating efficiency of claim 11, further comprising an anti-soldering layer partially covered on the conducting layer.

13. The manufacturing method for LED illuminator module with high heat-dissipating efficiency of claim 11, wherein a wiring step is applied to the LEDs, each of the LEDs has a pair of wires, contiguous two of the LEDs are connected with the wires.

14. The manufacturing method for LED illuminator module with high heat-dissipating efficiency of claim 11, wherein the step of forming the insulated layer further comprises a step of forming a plurality of insulated strip portions, wherein the insulated strip portions are arranged on the flat heat pipe in a parallel way and located between the LED-setting portions; and wherein the step of forming the conducting layer further comprising a step of forming a plurality of conducting strip portions covered on the insulated strip portions.

15. The manufacturing method for LED illuminator module with high heat-dissipating efficiency of claim 11, further comprising a step of providing a partition ring on a periphery of the LEDs, wherein the partition ring is an opaque thermosetting plastic frame.

16. The manufacturing method for LED illuminator module with high heat-dissipating efficiency of claim 11, further comprising a step of forming a concave portion on the flat heat pipe, wherein the concave portion has a flat bottom surface, wherein the LED-setting portions and the LEDs are disposed on the flat bottom surface, and the encapsulation is fixed in the concave portion.

17. The manufacturing method for LED illuminator module with high heat-dissipating efficiency of claim 16, wherein the pair of insulated electrode portions, and the pair of conducting electrode portions are formed outside the concave portion.

18. The manufacturing method for LED illuminator module with high heat-dissipating efficiency of claim 16, wherein the concave portion is surrounded by a plurality of blocking walls, wherein the blocking walls are oblique and reflects light from the LEDs.

* * * * *